United States Patent [19]
Shindo

[11] Patent Number: 5,933,363
[45] Date of Patent: Aug. 3, 1999

[54] ASSOCIATIVE MEMORY HAVING COMPARATOR FOR DETECTING DATA MATCH SIGNAL

[75] Inventor: Takeshi Shindo, Tokyo, Japan

[73] Assignee: NEC Corporation, Tokyo, Japan

[21] Appl. No.: 09/017,204

[22] Filed: Feb. 2, 1998

[30] Foreign Application Priority Data

Aug. 20, 1996 [JP] Japan ............................ 8-220370

[51] Int. Cl.$^6$ .................................................. G11C 15/00
[52] U.S. Cl. ........................................ 365/49; 365/189.07
[58] Field of Search ............................... 365/49, 189.07, 365/190

[56] References Cited

U.S. PATENT DOCUMENTS

| | | | |
|---|---|---|---|
| 5,226,005 | 7/1993 | Lee et al. ................................. | 365/49 |
| 5,515,320 | 5/1996 | Miwa ...................................... | 365/185.01 |
| 5,646,878 | 7/1997 | Samra ..................................... | 365/49 |
| 5,699,288 | 12/1997 | Kim et al. ............................... | 365/49 |

FOREIGN PATENT DOCUMENTS

| | | |
|---|---|---|
| 2-192098 | 7/1990 | Japan . |
| 1119440 | 7/1968 | United Kingdom . |
| 1486032 | 9/1977 | United Kingdom . |

*Primary Examiner*—David Nelms
*Assistant Examiner*—David Lam
*Attorney, Agent, or Firm*—Foley & Lardner

[57] ABSTRACT

In order to provide an associative memory having a low power consumption, for which data reading/writing can be performed and for which the operational speed is not decreased even during the forming of a large word, a memory cell array of b bits×w words is constituted by m×b columns and w/m rows (where m is an integer of 2 or greater). Provided are m data match signal lines for each row in the memory cell array, and in the same row of the memory cell arrays for individual bits, m memory cells are connected to m different data match signal lines. A bit line pair used for transmitting information to a memory circuit is separated from a data search line pair used for transmitting information to a comparator. The data search line is disposed on either side of a memory cell, so that adjacent memory cells for each bit in the same row of the memory cell can employ in common one of the data search line pairs located between their memory cells.

6 Claims, 7 Drawing Sheets

ASSOCIATIVE MEMORY HAVING COMPARATOR FOR DETECTING DATA MATCH SIGNAL

BACKGROUND OF THE INVENTION

1. Field of the Invention

The present invention relates to an associative memory in which data are stored, and also in which a match between stored data and data to be searched for is detected and output.

2. Description of the Prior Art

In order to make it easier to exercise operational control and to reduce power consumption, a conventional associated memory, which is disclosed in, for example, Japanese Unexamined Patent Publication No. Hei 2-192098, includes a memory circuit, a comparator and match detection signal lines. In this memory, since a match detection signal line for each word is held at an "L" level potential only during the course of a comparison process, a bit line controller is not required and there is a reduction in the consumption of power.

The associative memory, proposed by the above mentioned publication is the associative memory shown in FIG. 2 that employs the memory cell shown in FIG. 1.

In FIG. 1, showing a memory cell C in the conventional associative memory proposed in the above mentioned publication, a P channel MOS transistor (hereinafter referred to as a "PMOS") 501 and an N channel MOS transistor (hereinafter referred to as an "NMOS") 503 constitute a first inverter, and a PMOS 502 and an NMOS 504 constitute a second inverter. The first and the second inverters are connected together in a cross-strapped manner (i.e., their input terminals and output terminals are alternately connected) to constitute a flop-flop. An NMOS 505 and an NMOS 506 are connected between the common connection points of the first and the second inverters and paired complementary bit lines BLT and BLB, and the gates of the NMOS 505 and the NMOS 506 are connected to a word line WL so as to constitute a memory circuit 511. An NMOS 507 and an NMOS 509, and an NMOS 508 and an NMOS 510 are connected in series between a data match signal line ML and a match detection control signal line MCL, the gates of an NMOS 509 and an NMOS 510 being connected to the common connection points of the first and the second inverters, and the gates of the NMOS 507 and the NMOS 508 being connected to bit lines BLT and BLB, and thereby constitute a comparator 512.

FIG. 2 is a block diagram illustrating an associative memory constituted by the memory cells in FIG. 1. In FIG. 2, C11 to Cb1 denote memory cells; reference numeral 601, a memory cell array constituted by b memory cells; Di1 to Dib, input data; reference numerals 6021 to 602b, input data inverters; BLT1 and BLB1 to BLB1 and BLBb, bit line pairs; reference numeral 603, a write signal line; 604, a decoder for controlling word lines; 605, a precharge signal line for precharging data match signal lines ML to a high level; 606, a comparison signal line establishing a comparison operating cycle; 607, a discharge signal generator for discharging match detection signal lines MCL and bringing them to low level; 608, a discharge signal line; 609, precharge circuits; 610, discharge circuits; 611, sense amplifiers for amplifying signals on the data match signal lines ML; 612, output lines for the sense amplifiers 611; and 6131 to 613i, an assembly each for one word. The arrangement shown in FIG. 2 is an associative memory consisting of b bits and i words. When the comparison signal 606 goes high, a comparison of the input data Di with stored data is initiated.

The comparison operation for the associative memory in FIG. 2 will now be described while referring to a signal waveform diagram in FIG. 3, with the supposition that a data "0" is stored in the memory cell shown in FIG. 1, i.e., that the output of the first inverter, which includes the PMOS 501 and the NMOS 503, is low and the output of the second inverter, which includes the PMOS 502 and the NMOS 504, is high.

In FIG. 3, when the precharge signal line 605 is high during a period in which the clock for cycle A is high (H), the precharge operation for the data match signal line ML1 is halted. Since the discharge signal line 608 also goes high, the match detection control signal line MCL1 is brought low by the discharge circuit 610. Further, upon the receipt of data Di the bit line BLT1 goes high and the BLB1 goes low. At this time, since the gates of the NMOS 507 and the NMOS 509 in FIG. 1 go high and become conductive, the data match signal line ML (ML1) and the match detection control signal line MCL (MCL1) are connected together, so that the data match signal line ML1 goes low.

Following this, when the clock goes low (L), the discharge signal line 608 also goes low and the discharge operation initiated by the match detection control signal MCL1 is halted. In addition, since the precharge signal line 605 also goes low, the data match signal line ML1 is precharged to a high level by the precharge circuit 609. At this time the levels at the bit lines BLT1 and BLB1 do not change, so that the data match signal line ML1 and the match detection control signal line MCL1 are still connected and the match detection control signal line MCL1 goes high.

Next, since the precharge signal line 605 is high during a period in which the clock for cycle B is high (H), the precharge operation for the data match signal line ML1 is halted. Since the discharge signal line 608 also goes high, the match detection control signal line MCL1 is brought low by the discharge circuit 610.

Furthermore, upon receipt of the data Di the bit line BLT1 goes low and BLB1 goes high. At this time, since the gate potential of the NMOS 510 is still low, even though the gate of the NMOS 508 in FIG. 1 goes high, the data match signal line ML (ML1) and the match detection control signal MCL (MCL1) are not connected together and the data match signal line ML1 is not changed and is maintained high.

As is described above, in the comparison operation performed by the associative memory shown in FIG. 2, the data match signal line ML is shifted from high to low when the stored data and the input data do not match. In addition, since the memory cells C1k to Cbk are connected in parallel to the data match signal line MLk and the match detection control signal line MCLk, the data match signal line MLk will be brought low if there is even one bit that is not matched in the b-bit data that constitute a word.

The problems that arise with the above described associative memory will now be described.

Before data are to be read from the memory cell, the bit lines must be precharged at a high level and data on the bit lines must be erased in order to prevent damage to the data in the memory cell due to the presence of a potential difference between the bit lines. However, since precharging of the bit lines is not performed for the conventional associative memory proposed in Japanese Unexamined Patent Publication No. Hei 2-192098, data can not be read from the memory cell.

In addition, since the memory cell in the above described associative memory is constituted by b columns and i word rows, i memory cells equivalent in count to the total word count are connected to the bit lines BLT and BLB. Therefore, when the number of word lines i is large, the lengths of the bit lines BLT and BLB are increased, and the diffusion capacitances and the gate capacitances of the NMOS 505 and NMOS 507 (and the NMOS 506 and the NMOS 508) that are connected to them are also increased, with the result that the total capacitance is increased. And the increase in the capacitances of the bit lines BLT and BLB results an increase in the consumption of power and a reduction in the operational speed.

The same capacitance is provided for the data match signal line ML and the match detection control signal line MCL. And when, as the result of the comparison, it is found that the stored data and the input data do not match in one cycle, a charge/discharge is performed along the data match signal line ML and the match detection control signal line MCL. Generally, since in many cases data match is not obtained as a result of the comparison, the consumption of power is increased.

SUMMARY OF THE INVENTION

To overcome the above problems, it is one object of the present invention to provide an associative memory having a low power consumption, for which data reading/writing can be performed and for which the operational speed is not decreased even during the forming of a large word.

To achieve the above object, according to an associative memory of the present invention, a cell array for one bit is constituted by a plurality of rows (m rows), and a plurality (m) of data match signal lines arranged to constitute a single row. Along one row in a memory cell array, m memory cells for each bit are respectively connected to the m data match signal lines. A bit line pair, along which information is transmitted to a memory circuit in a memory cell, is separated from a data search line pair, along which information is transmitted to a comparator in a memory cell. The paired data search lines are located on either side of the memory cell, so that, in a memory cell array for an individual bit, adjacent memory cells along the same row employ one of the paired data search lines located between the memory cells.

According to the present invention, provided is an associative memory, wherein memory cells, each of which includes a memory circuit for storing data and a comparator for detecting a match between data stored in the memory circuit with data to be searched for, are arranged in a matrix to form a cell array for an individual bit; wherein bit lines along which the stored data are transmitted and data search lines along which the data to be searched for are transmitted, are located in the columnar direction of the cell arrays, for each an individual bit; wherein word lines for selective control of the memory circuit and data match signal lines for output of the comparator are located in the direction of the rows; wherein the word lines and the data match signal lines are mutually connected in each of the cell arrays for an individual bit; wherein the cell array for one bit is constituted by a plurality of columns (m); and wherein the number of the data match signal lines, for the output of the comparator, arranged for one column of the cell array is equivalent to the number of the columns (m) and the number of the data search lines arranged for one column of the cell array is one greater (m+1) than the number of columns.

In this invention, the (m+1) data search lines are located on either side of the cell array for an individual bit and between the columns, and the adjacent memory cells in the same row of the cell array for an individual bit employ in common the data search line located between the columns, and the memory cells in the same row are connected respectively to the data match signal lines.

A summary of the present invention will now be presented. According to the present invention, a memory cell array of 6 bits×w words is constituted by m×b columns and w/m rows (where m is an integer of 2 or greater). Provided are m data match signal lines for each row in the memory cell array, and in the same row of the memory cell arrays for individual bits, m memory cells are connected to m different data match signal lines. A bit line pair used for transmitting information to a memory circuit is separated from a data search line pair used for transmitting information to a comparator. The data search line is disposed on either side of a memory cell, so that adjacent memory cells for each bit in the same row of the memory cell can employ in common one of the data search line pairs located between their memory cells. With this arrangement, power consumed during the operation can be reduced, a high speed access can be provided, and an increase in the circuit area can be efficiently prevented.

DETAILED DESCRIPTION OF THE PREFERRED EMBODIMENTS

The present invention will now be described in detail while referring to the accompanying drawings.

Figure 1:
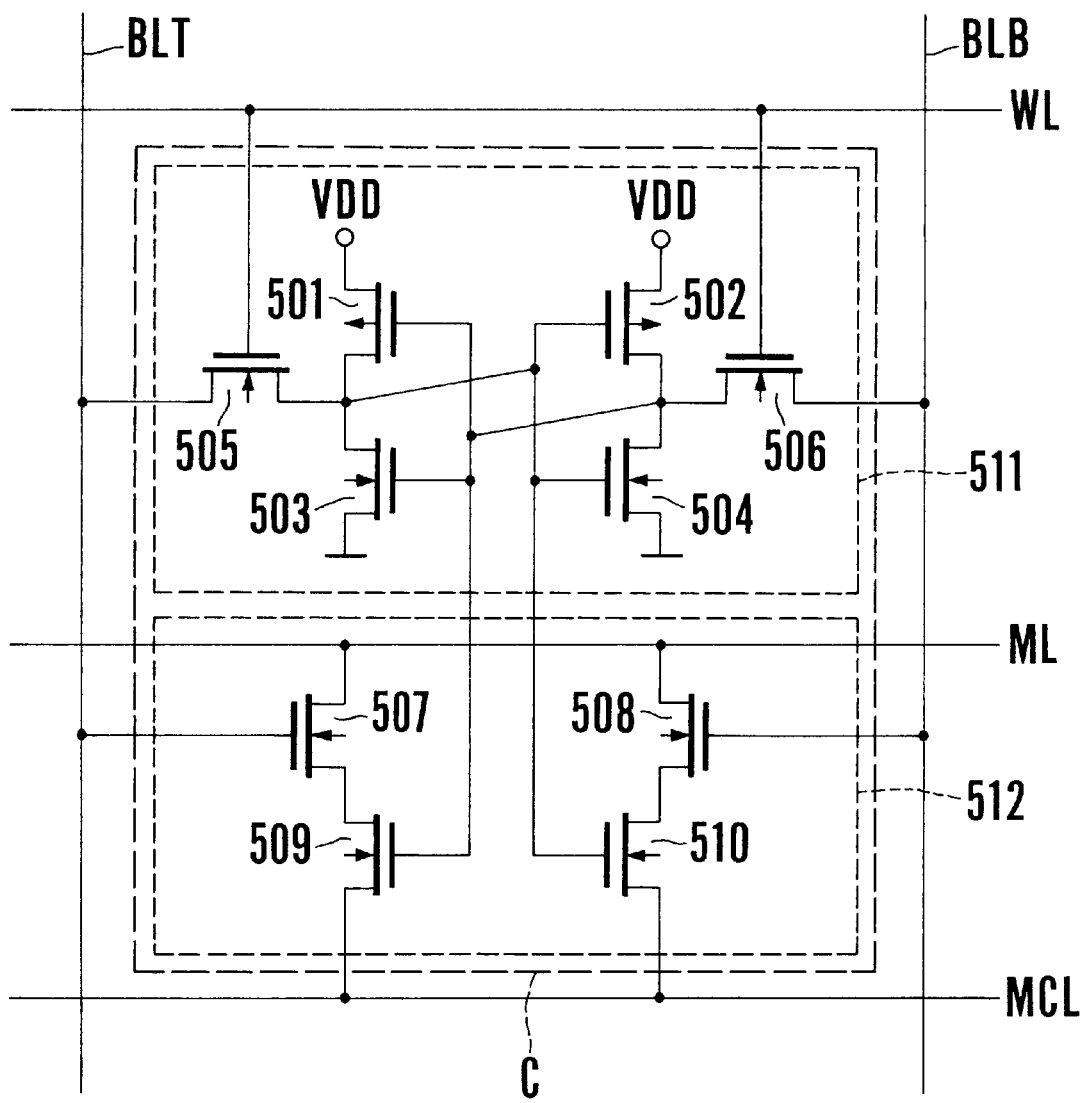
FIG. 1 is a diagram illustrating the circuit structure of a memory cell in the prior art.
Figure 2:
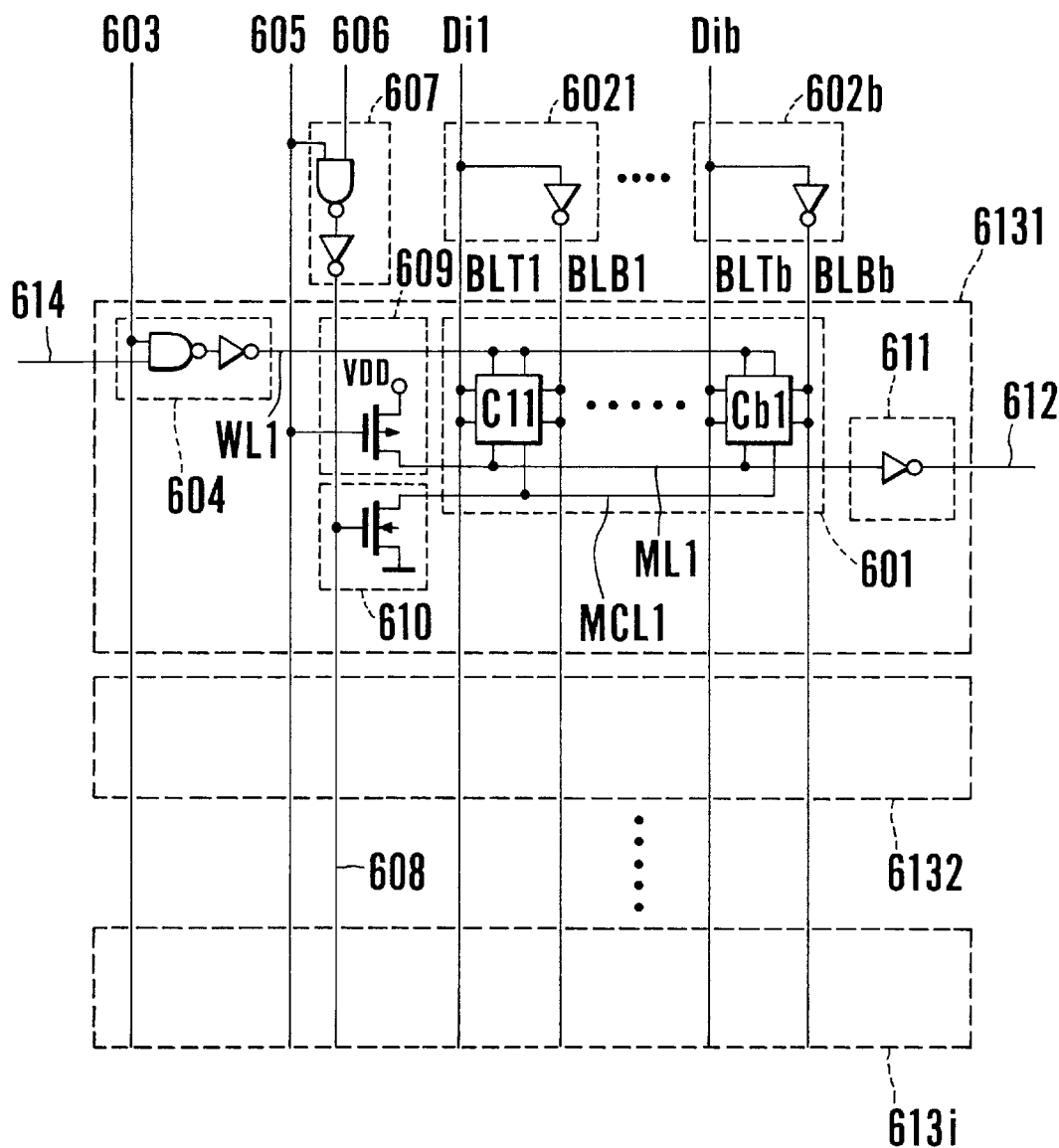
FIG. 2 a block diagram illustrating the arrangement of a conventional associative memory.
Figure 3:
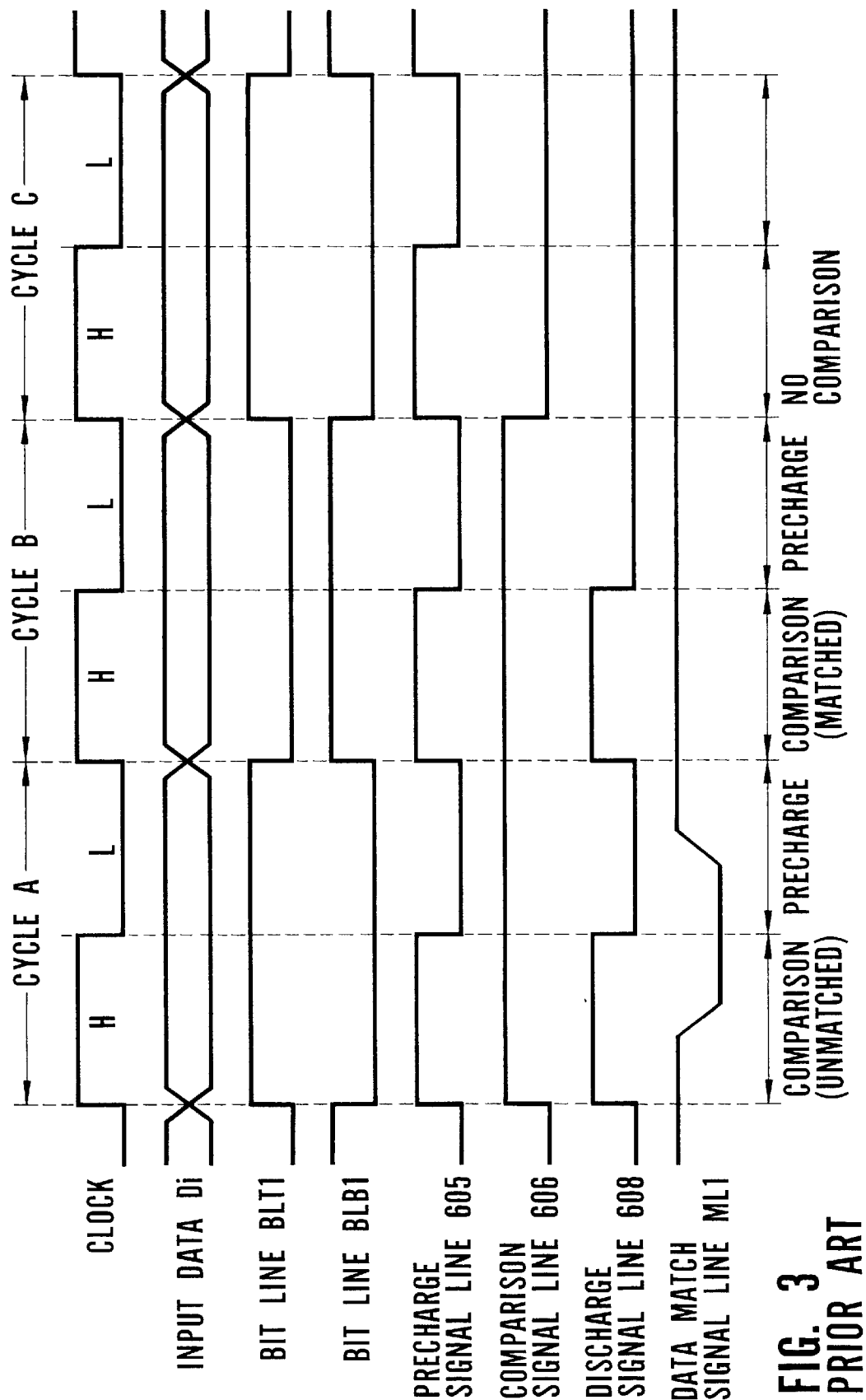
FIG. 3 is a diagram showing operation waveforms for explaining an operation performed in the prior art.
Figure 4:
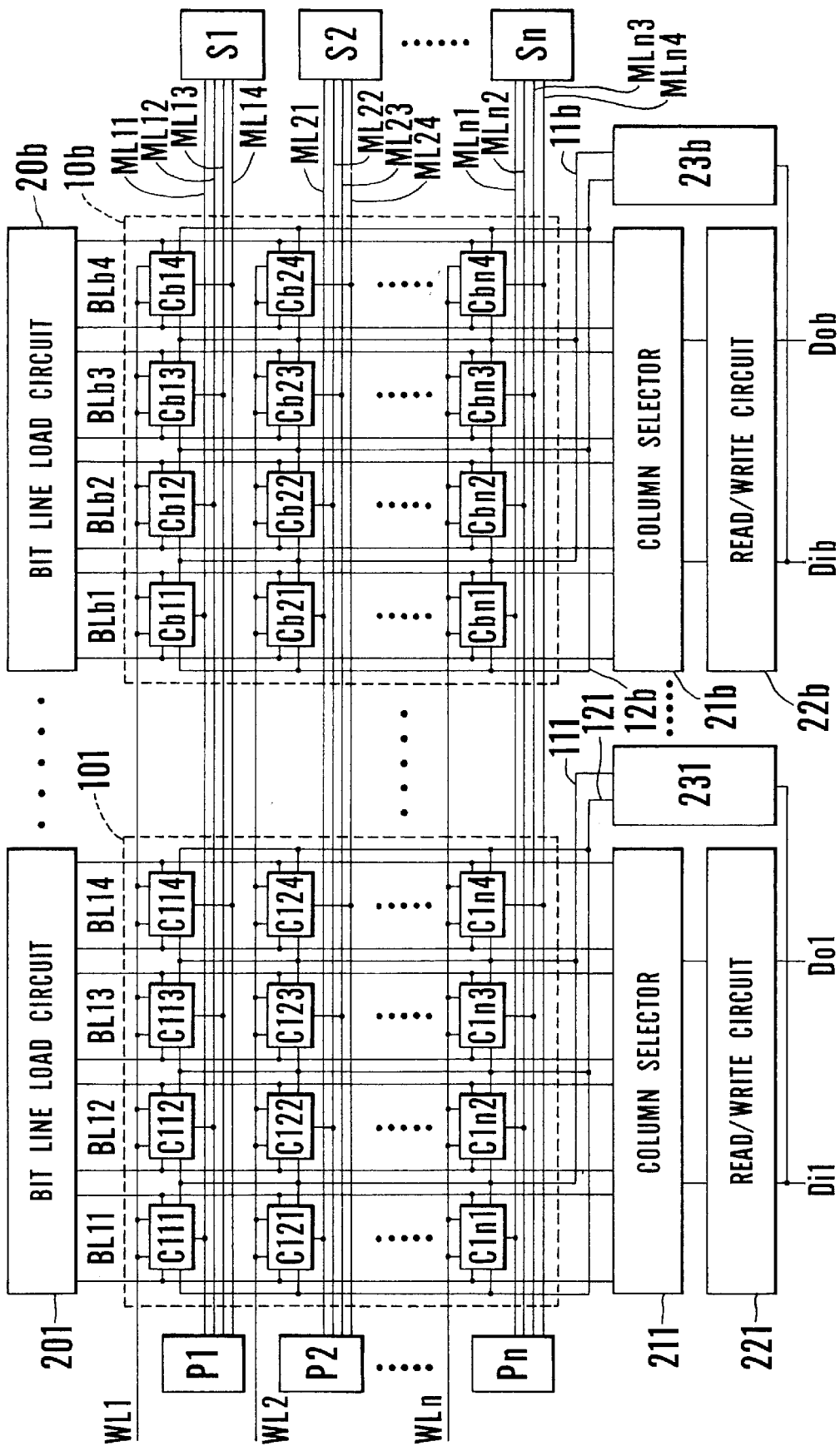
FIG. 4 is a block diagram illustrating the arrangement for an associative memory according to the present invention.

FIG. 4 is a block diagram illustrating the arrangement of an associative memory according to the present invention. In FIG. 4, C111 to Cbn4 denote memory cells; 101 to 10b, memory cell arrays constituted by 4×n memory cells; 111 and 121 to 11b and 12b, data search line pairs; BL11 to BL14 and BLb1 to BLb4, bit line pairs; 201 to 20b, bit line load circuits for precharging bit lines for memory reading/writing operations; 211 to 21b, column selectors for employing an address to select one of the four bit line pairs; 221 to 22b, read/write circuits for performing a memory reading/writing operation; Di1 to Dib, input data to be written to a memory or to be searched for in a memory; DO1 to DOb, data read from the memory; 231 to 23b, search data drivers for transmitting data to be searched for along data search lines during a comparison operation; ML11 to MLn4, data match signal lines along which comparison results are transmitted; P1 to Pn, data match signal line precharge circuits for precharging data match signal lines to high in advance of a comparison operation; S1 to Sn, match signal detectors for detecting signals (comparison results) transmitted along the data match signal lines ML11 to MLn4; and WL1 to WLn, word lines used for the control of reading/writing relative to the memory cells C111 to Cbn4.

The arrangement shown in FIG. 4 is an illustration of an associative memory of b bits·4×n words, in which each memory cell is divided into four columns.

Figure 5:
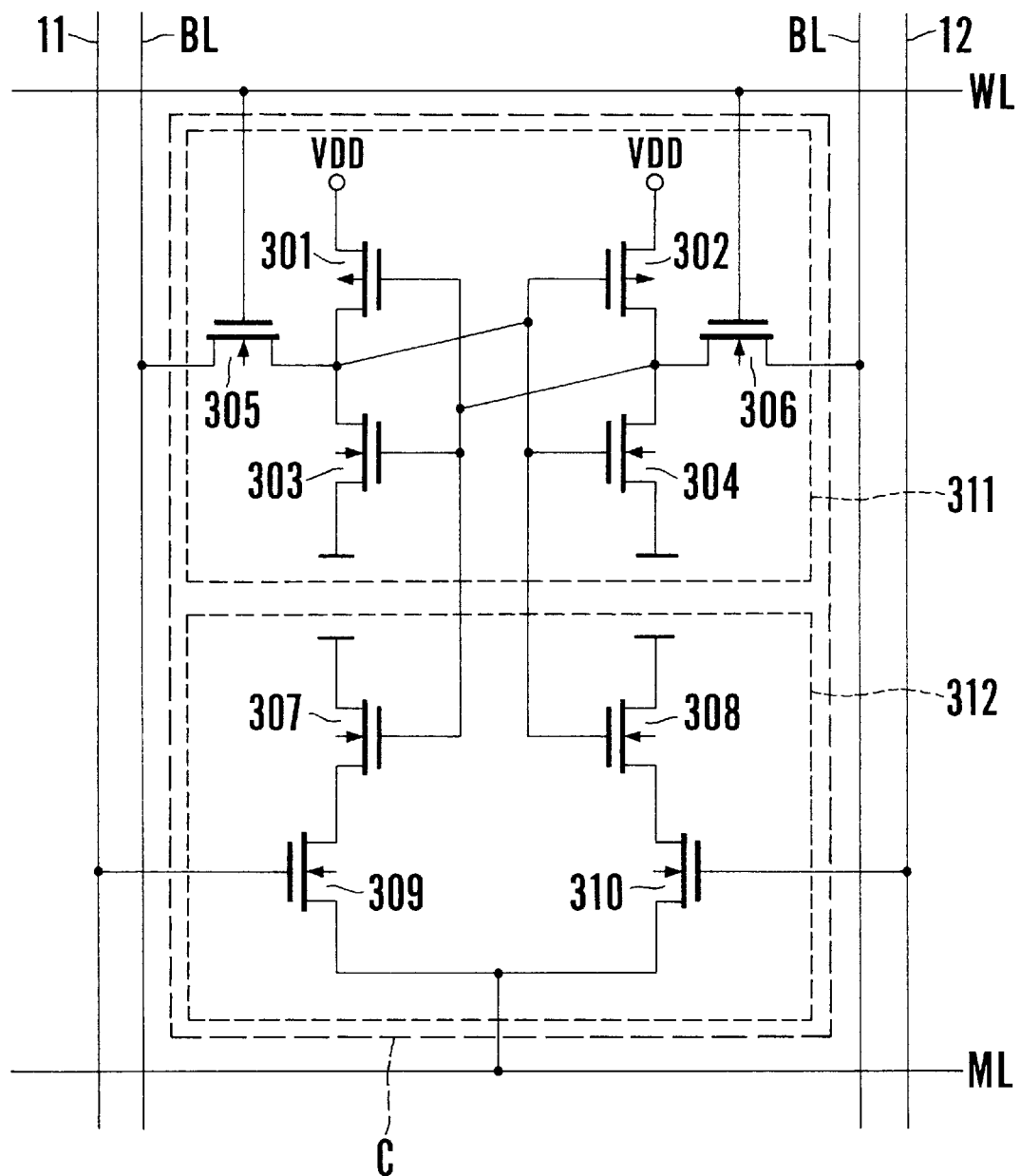
FIG. 5 is a diagram illustrating the circuit structure of a memory cell according to one embodiment of the present invention.

A specific arrangement for a memory cell will now be described as one embodiment of the present invention. FIG. 5 is a diagram illustrates of an exemplary memory cell C that the circuits in each of the memory cells C111 to Cbn4 in FIG. 4.

In a memory cell in FIG. 5, a P channel MOS transistor (hereinafter referred to as a "PMOS") 301 and an N channel MOS transistor (hereinafter referred to as an "NMOS") 303 constitute a first inverter, and a PMOS 302 and an NMOS 304 constitute a second inverter. The first and the second inverters are connected in a cross-strapped manner (i.e., their input terminals and output terminals are mutually connected) to form a flip-flop. An NMOS 305 and an NMOS 306 are connected between the common connection points of the first and the second inverters and the bit line pairs BL, and the gates of the NMOS 305 and the NMOS 306 are connected to the word lines WL to form a memory circuit 311.

The NMOS 307 and the NMOS 309, and the NMOS 308 and the NMOS 310 are connected in series between the data match signal line ML and the ground GND, and the gates of the NMOS 307 and the NMOS 308 are connected to the common connection points (connection points of the input terminals and the output terminals) of the first and the second inverters, the gates of the NMOS 309 and the NMOS 310 being connected to data search lines 11 and 12 to constitute a comparator 312.

Figure 6:
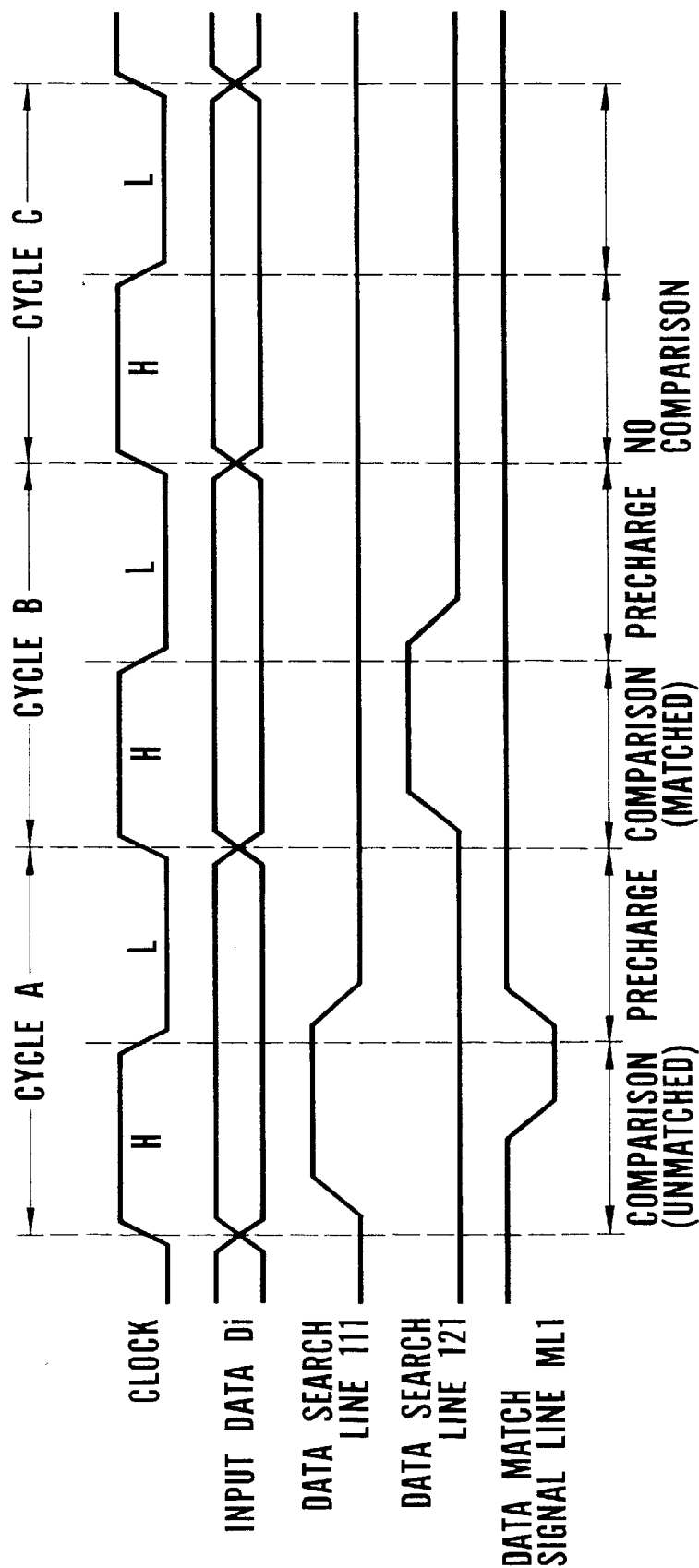
FIG. 6 is a diagram showing operation waveforms for explaining the, operation performed in the embodiment of the present invention.

FIG. 6 is a signal waveform diagram showing an example of signal waveforms during the comparison operation performed in the associative memory according to one embodiment of the present invention.

The comparison operation of the associative memory according to the embodiment of the present invention will now be explained while referring to FIGS. 4 to 6.

Assume that a data "0" is stored in the memory cell in FIG. 5, i.e., that the output of the first inverter, which includes the PMOS 301 and the NMOS 303, is low and the output of the second inverter, which includes the PMOS 302 and the NMOS 304, is high.

In FIG. 6, before the clock for cycle A goes high (H), a precharging of the data match signal lines ML11 to MLn4 is completed by the data match signal line precharge circuits P1 to Pn, and the data match signal lines ML11 to MLn4 are high. The data search lines 111 to 12b are brought low by the search data drivers 231 to 23b.

Then, during a period in which the clock for cycle A is high, in consonance with the input data Di, one of each of the data search line pairs 111 and to 11b, and 121 to 12b is driven high, in this example, data serarch line pair 111, by the corresponding search data driver 231 to 23b. At this time, the gates of the NMOS 307 and the NMOS 309 in FIG. 5 also go high and become conductive. Therefore, the data match signal line ML (ML11) is connected to the ground terminal GND, and is brought low.

When the clock of the cycle A goes low (L), the data match signal lines ML11 to MLn4 are precharged at a high level by the data match signal line precharge circuits P1 to Pn, and the data search lines 111 to 12b are brought low by the search data drivers 23 to 23b.

During a period in which the clock for cycle B is high, the precharging of the data match signal lines ML11 to MLn4 is halted. In consonance with the input data Di, one of each of the data search line pairs 111 to 11b and 121 to 12b is driven high, in this example, data search line pair 121, by the corresponding search data driver 231 to 23b. Since the gate of the NMOS 308 is low, even though the gate of the NMOS 310 goes high, the data match signal line ML (ML11) is not connected to the ground terminal GND and is maintained high.

As is described above, in the comparison operation for the associative memory in FIG. 4, when the stored data and the input data do not match, the data match signal line ML is adjusted from high to low. Since the memory cells C1km to Cbkm are connected in parallel to the data match signal lines MLkm, the data match signal lines MLkm are brought low if there is even one bit that is not matched in the b-bit data that form a word.

The reading/writing of data for the memory is performed in the same manner as for an ordinary RAM (Random Access Memory) by using the word lines WL1 to WLn, the bit line pairs BL11 to BLb4, the bit line load circuits 201 to 20b, the column selectors 211 to 21b, and the read/write circuits 221 to 22b.

Before data reading/writing is initiated, the bit line pairs BL11 to BLb4 are precharged to a high level by the bit line load circuits 201 to 20b.

The column selectors 211 to 21b select b bit line pairs from the bit line pairs BL11 to BLb4, one of the word lines WL1 to WLn goes to high, and b memory cells for one word, which are selected from among the memory cells C111 to Cbn4, are connected to the read/write circuits 221 to 22b.

In the data reading operation, data in the selected memory cells are transmitted, via the bit line pairs BL11 to BLb4 and the column selectors 211 to 21b, to the read/write circuits 221 to 22b. The data are amplified/detected by the read/write circuits 221 to 22b, and the results are output as the read data DO1 to DOb.

For writing data, the input data Di1 to Dib are written to selected memory cells by the read/write circuits 221 to 22b.

As is described above, in the associative memory in this embodiment, since the route for the transmission of data used for the reading/writing operation is separated from the route for the transmission of data used for comparison, the comparison operation is not affected by the reading/writing operation, and the reading/writing operation is not affected by the comparison operation.

Furthermore, in this embodiment, since a memory cell for one bit is divided into four columns, the number of data search lines is 2.5 times that of the prior art, while the length of each line is about one quarter that of the prior art, so that the total length of the lines is reduced and is only 62.5% that of the prior art.

In addition, since the number of transistors in a memory cell connected to the data search lines is also fewer than that in the prior art, the capacitances of the transistors are reduced.

In addition, as the number of transistors connected to the bit lines of an ordinary memory is also smaller than that in the prior art, the capacitances of transistors are further reduced.

Figure 7:
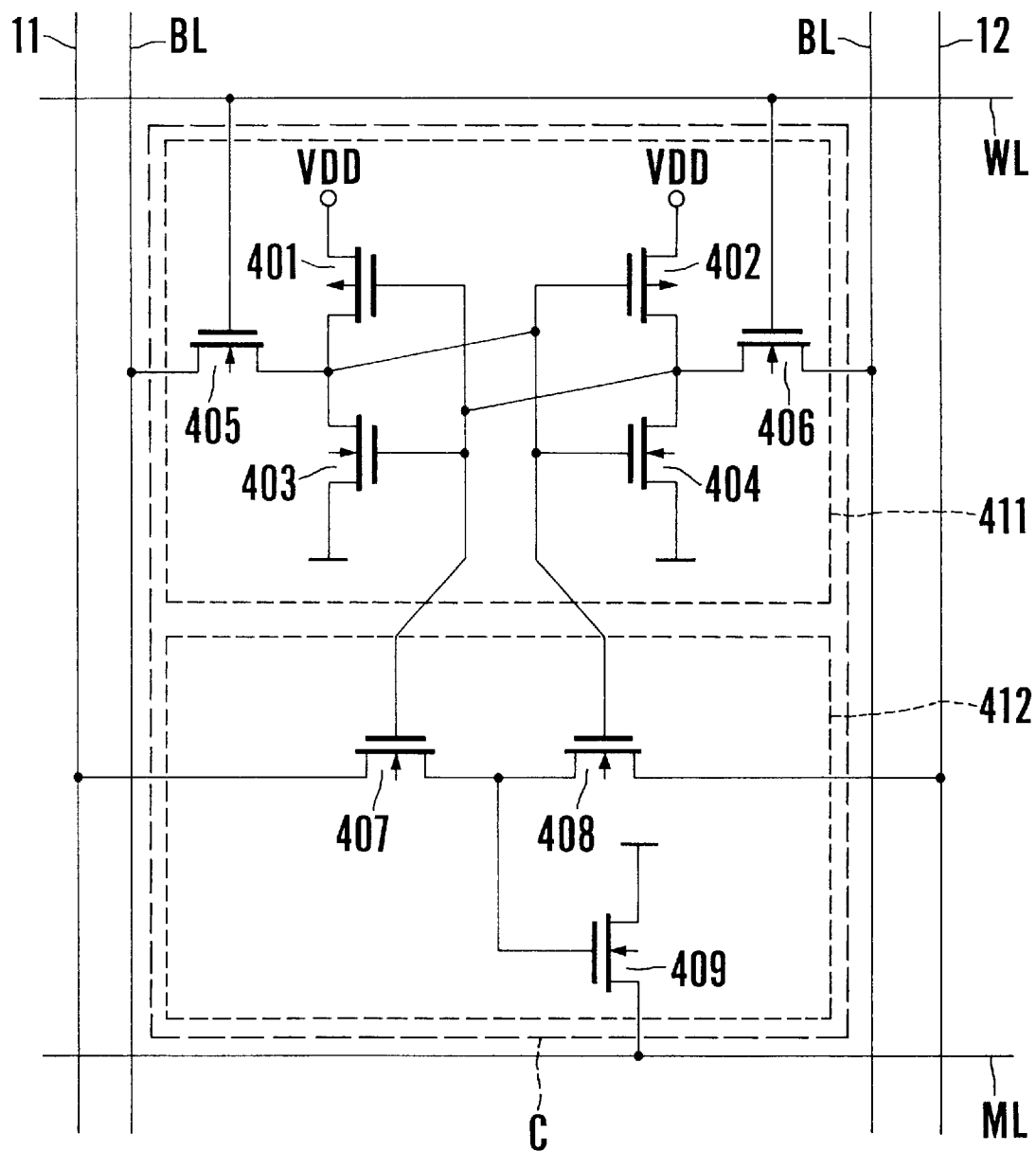
FIG. 7 is a diagram showing the circuit structure of a memory cell according to another embodiment of the present invention.

Another embodiment of the present invention will now be described. FIG. 7 is a diagram illustrating a memory cell according to this embodiment of the present invention. This memory cell is employed for the memory cells C111 to Cbn4 in the associative memory illustrated in FIG. 4.

In a memory cell in FIG. 7, a PMOS 401 and an NMOS 403 constitute a first inverter, and a PMOS 402 and an NMOS 404 constitute a second inverter. The first and the second inverters are connected in a cross-strapped manner (i.e., their input terminals and output terminals are mutually connected) to form a flip-flop. An NMOS 405 and an NMOS 406 are connected between the common connection points (the connection points for the input terminals and the output terminals) for the first and the second inverters and bit line pairs BL, and to form a memory circuit 411 the gates of the NMOS 405 and the NMOS 406 are connected to the word lines WL.

The NMOS 407 and the NMOS 408 are connected in series between the data search lines 11 and 12; gates of the NMOS 407 and the NMOS 408 are connected to the common connection points for the first and the second inverters; and the NMOS 409, whose gate is connected to the common connection point of the NMOS 407 and the NMOS 408, is connected between the data match signal line ML and the ground GND to constitute a comparator 412.

The comparison operation performed by the associative memory according to the embodiment of the present invention will now be explained while referring to FIGS. 4, 6 and 7.

Assume that a data "0" is stored in the memory cell in FIG. 7, i.e., the output of the first inverter, which includes the PMOS 401 and the NMOS 403, is low and the output of the second inverter, which includes the PMOS 402 and the NMOS 404, is high.

In FIG. 6, before the clock for cycle A goes high (H) a precharge of the data match signal lines ML11 to MLn4 is completed by the data match signal line precharge circuits P1 to Pn, and the data match signal lines ML11 to MLn4 are high. The data search lines 111 to 12b are brought low by the search data drivers 231 to 23b.

Then, during a period in which the clock for cycle A is high, in consonance with input data Di, one of each of data search line pairs 111 to 11b and 121 to 12b is driven high, in this example, data search line pair 111, by the corresponding search data driver 231 to 23b. At this time, since the gate of the NMOS 407 in FIG. 7 is high, the high level of the data search line 111 is transmitted to the gate of the NMOS 409. The NMOS 409 is, therefore, rendered conductive, and the data match signal line ML (ML11) is connected to the ground terminal GND and is pulled low.

When the clock for cycle A goes low (L), the data match signal lines ML11 to MLn4 are precharged at a high level by the data match signal line precharge circuits P1 to Pn, and the data search lines 111 to 12b are brought low by the search data drivers 231 to 23b.

During a period in which the clock for cycle B is high, the precharging of the data match signal lines ML11 to MLn4 is halted. In consonance with the input data Di, one of each of the data search line pairs 111 to 11b and 121 to 12b is driven high, in this example, data search line pair 121, by the corresponding search data driver 231 to 23b. Since the gate of the NMOS 407 in FIG. 7 is high, the low level of the data search line 111 is transmitted to the gate of the NMOS 409. The NMOS 409 is, therefore, rendered non-conductive, and the data match signal line ML (ML11) is not connected to the ground terminal GND and is maintained high.

As is described above, when the memory cell in FIG. 7 is employed for the arrangement shown in FIG. 4, the comparison can be performed in the same manner as when the memory cell in FIG. 5 is employed.

The present invention has been explained by employing the preferred embodiments, but is not limited to the block arrangements shown for these embodiments; it can be variously modified according to the principle of the present invention. And the same operation can be performed when the memory cell array is divided, for example, into 2, 8 or 16 columns.

As is described above, according to the present invention, since a memory cell array for one bit is divided into a plurality of columns (e.g., four columns), the total length of the data search lines can be drastically shorter than that in the prior art, wherein one line is allocated for one bit. For example, as is shown in the embodiments of the present invention, the total length of the data search lines is reduced to 62.5% of that for the prior art.

Furthermore, according to the present invention, since the number of transistors in a memory cell connected to the data search lines is fewer than that in the prior art, their capacitances can be considerably reduced. As a result, power consumption, which is the problem encountered with the conventional associative memory disclosed in Japanese Unexamined Patent Publication No. Hei 2-192098, can be drastically reduced.

In addition, since the capacitances of the bit lines of an ordinary memory are also reduced, compared with the operation of the prior art, the speed of the reading/writing operation performed for the memory can be increased and power consumption can be reduced.

If one line is allocated for each bit of a great number of words, the shape of each block in the associative memory will be vertically elongated. The present invention, however, can provide relief for this problem.

Further, according to the present invention, since one data search line is used in common by adjacent memory cells, the number of signal lines can be reduced, and the increase in the area occupied by the associative memory blocks can be limited.

What is claimed is:

1. An associative memory cell, wherein a cell array for one bit is comprised of:

a plurality of columns and m rows, wherein m is an integer greater than zero, and m data match signal lines are arranged to comprise a single row;

wherein along one row in said memory cell array, m memory cells for each bit are respectively connected to said m data match signal lines;

wherein a bit line pair, along which information is transmitted to a memory circuit in a memory cell, is separated from a data search line pair, along which information is transmitted to a comparator in a memory cell;

wherein said paired data search lines are located on either side of said memory cell, so that, in a memory cell array for an individual bit, adjacent memory cells along the same row employ one of the paired data search lines located between said memory cells, wherein said memory cell has a memory circuit that includes a first inverter and a second inverter, input terminals and output terminals of which are connected together, and a first transfer device and a second transfer device, which are inserted between common connection points of said first and said second inverters and which have bit line pairs and control terminals that are connected to word lines;

wherein said comparator, for detecting a match between data stored in said memory circuit and data to be searched for, is constructed by connecting, in series between said data match signal line and a common potential line, a first switch device having a control terminal that is connected to one of a data search line pair and another terminal connected to said data match signal line, and a second switch device having a control terminal that is connected to one common connection point of said first and said second inverters, and another terminal connected to said common potential line, and by connecting, in series between said data match signal line and said common potential line, a third switch device having a control terminal that is connected to the other data search line and another terminal connected to said data match signal line, and a fourth switch device having a control terminal that is connected to another common connection point of said first and said second inverters, and another terminal connected to said common potential line.

2. An associative memory cell, wherein a cell array for one bit is comprised of:

a plurality of columns and m rows, wherein m is an integer greater than zero, and m data match signal lines are arranged to comprise a single row;

wherein along one row in said memory cell array, m memory cells for each bit are respectively connected to said m data match signal lines;

wherein a bit line pair, along which information is transmitted to a memory circuit in a memory cell, is separated from a data search line pair, along which information is transmitted to a comparator in a memory cell; and wherein said paired data search lines are located on either side of said memory cell, so that, in a memory cell array for an individual bit, adjacent memory cells along the same row employ one of the paired data search lines located between said memory cells, wherein said memory cell has a memory circuit that includes a first inverter and a second inverter having input terminals and output terminals that are connected together, and a first transfer device and a second transfer device that are inserted respectively between common connection points, of said first and said second inverters, and said bit line pairs, and that have control terminals connected to word lines;

wherein said comparator, for detecting a match between data stored in said memory circuit and data to be searched for, is constructed by connecting, in series between said data search line pair, a first switch device having a control terminal that is connected to one common connection point of said first and said second inverters, and a second switch device having a control terminal that is connected to another common connection point of said first and said second inverters, and by connecting, between said data match signal line and a common potential line, a third switch device having a control terminal that is connected to a common connection point of said first and said second switch devices.

3. An associative memory cell, wherein a cell array for one bit is comprised of:

(a) a plurality of columns and m rows, (b) wherein m is an integer greater than zero, and (c) m data match signal lines are arranged to comprise a single row;

(d) wherein along one row in said memory cell array,
m memory cells for each bit are respectively connected to said m data match signal lines;

(e) wherein a bit line pair, along which information is transmitted to a memory circuit in a memory cell, is separated from (f) a data search line pair, along which information is transmitted to a comparator in a memory cell; and (g) wherein said paired data search lines are located on either side of said memory cell, so that, in a memory cell array for an individual bit, adjacent memory cells along the same row employ one of the paired data search lines located between said memory cells, (h) wherein said memory cell has a memory circuit that includes (i) a first inverter and a second inverter, input terminals and output terminals of which are connected together, and (j) a first transfer device and a second transfer device, which are inserted between common connection points of said first and said second inverters and which have bit line pairs and control terminals that are connected to word lines;

(k) wherein said comparator, for detecting a match between data stored in said memory circuit and data to be searched for, is constructed by connecting, in series between said data match signal line and a common potential line, (l) a first switch device having a control terminal that is connected to one of a data search line pair and (m) a second switch device having a control terminal that is connected to one common connection point of said first and said second inverters, and by connecting, in series between said data match signal line and said common potential line, (n) a third switch device having a control terminal that is connected to the other data search line (o) a fourth switch device having a control terminal that is connected to another common connection point of said first and said second inverters, and (p) wherein another terminal of at least one of said first and third switch devices are connected to one of said data match signal lines.

4. An associative memory as recited in claim 3, wherein said another terminal of both said first and third switch devices is connected to one of said data match signal lines.

5. An associative memory cell, wherein a cell array for one bit is comprised of:

(a) a plurality of columns and m rows, (b) wherein m is an integer greater than zero, and (c) m data match signal lines are arranged to comprise a single row;

(d) wherein along one row in said memory cell array,
m memory cells for each bit are respectively connected to said m data match signal lines;

(e) wherein a bit line pair, along which information is transmitted to a memory circuit in a memory cell, is separated from (f) a data search line pair, along which information is transmitted to a comparator in a memory cell; and (g) wherein said paired data search lines are located on either side of said memory cell, so that, in a memory cell array for an individual bit, adjacent memory cells along the same row employ one of the paired data search lines located between said memory cells, (h) wherein said memory cell has a memory circuit that includes (i) a first inverter and a second inverter, input terminals and output terminals of which are connected together, and (j) a first transfer device and a second transfer device, which are inserted between common connection points of said first and said second inverters and which have bit line pairs and control terminals that are connected to word lines;

(k) wherein said comparator, for detecting a match between data stored in said memory circuit and data to be searched for, is constructed by connecting, in series between said data match signal line and a common potential line, (l) a first switch device having a control terminal that is connected to one of a data search line pair and (m) a second switch device having a control terminal that is connected to one common connection point of said first and said second inverters, and by connecting, in series between said data match signal line and said common potential line, (n) a third switch device having a control terminal that is connected to the other data search line (o) a fourth switch device having a control terminal that is connected to another common connection point of said first and said second inverters, and (p) wherein another terminal of at least one of said second and fourth switch devices is connected to said common potential line.

6. An associative memory as recited in claim 5, wherein said another terminal of both said second and said fourth switch devices is connected to said common potential line.

* * * * *